(12) United States Patent
Chen et al.

(10) Patent No.: US 11,551,977 B2
(45) Date of Patent: Jan. 10, 2023

(54) METHODS FOR IMPROVEMENT OF PHOTORESIST PATTERNING PROFILE

(71) Applicant: Taiwan Semiconductor Manufacturing Co., Ltd., Hsinchu (TW)

(72) Inventors: Ke-Ming Chen, Hsinchu (TW); Ting-Jung Chang, Hsinchu (TW); Hsin-Chen Cheng, Hsinchu (TW); Chih-Tsang Tseng, Hsinchu (TW)

(73) Assignee: Taiwan Semiconductor Manufacturing Co., Ltd., Hsinchu (TW)

( * ) Notice: Subject to any disclaimer, the term of this patent is extended or adjusted under 35 U.S.C. 154(b) by 28 days.

(21) Appl. No.: 17/315,201

(22) Filed: May 7, 2021

(65) Prior Publication Data

US 2022/0359297 A1    Nov. 10, 2022

(51) Int. Cl.
  *H01L 21/8234*  (2006.01)
  *H01L 29/40*    (2006.01)
  *H01L 21/02*    (2006.01)
  *G11C 5/06*     (2006.01)
  *H01L 21/8238*  (2006.01)
  *H01L 29/417*   (2006.01)

(52) U.S. Cl.
  CPC ........ *H01L 21/823418* (2013.01); *G11C 5/06* (2013.01); *H01L 21/02057* (2013.01); *H01L 21/823475* (2013.01); *H01L 21/823814* (2013.01); *H01L 29/401* (2013.01); *H01L 29/41783* (2013.01)

(58) Field of Classification Search
  CPC ....... H01L 21/823418; H01L 21/02057; H01L 21/823475; H01L 21/823814; H01L 29/41783; G11C 5/06
  See application file for complete search history.

(56) References Cited

U.S. PATENT DOCUMENTS

| | | | |
|---|---|---|---|
| 8,030,154 B1 * | 10/2011 | Ozcan | H01L 29/7843 438/581 |
| 2006/0046482 A1 | 3/2006 | Verhaverbeke | |
| 2015/0132871 A1 | 5/2015 | Wang et al. | |
| 2018/0130704 A1 | 5/2018 | Li | |
| 2021/0134955 A1 | 5/2021 | Wang et al. | |
| 2021/0159122 A1 | 5/2021 | Lin et al. | |

FOREIGN PATENT DOCUMENTS

| | | |
|---|---|---|
| TW | 201250925 A | 12/2012 |
| TW | 202025246 A | 7/2020 |
| TW | 202025250 A | 7/2020 |

* cited by examiner

*Primary Examiner* — Joseph C. Nicely
(74) *Attorney, Agent, or Firm* — Seed IP Law Group LLP

(57) ABSTRACT

A method of forming a semiconductor structure is provided. The method includes forming a gate structure over an active region of a substrate, forming an epitaxial layer comprising first dopants of a first conductivity type over portions of the active region on opposite sides of the gate structure, applying a cleaning solution comprising ozone and deionized water to the epitaxial layer, thereby forming an oxide layer on the epitaxial layer, forming a patterned photoresist layer over the oxide layer and the gate structure to expose a portion of the oxide layer, forming a contact region including second dopants of a second conductivity type opposite the first conductivity type in the portion of the epitaxial layer not covered by the patterned photoresist layer, and forming a contact overlying the contact region.

20 Claims, 20 Drawing Sheets

METHODS FOR IMPROVEMENT OF PHOTORESIST PATTERNING PROFILE

BACKGROUND

In high performance integrated circuits, static random access memory (SRAM) devices have been used as on-chip memories, due to their intense access speed and compatibility with process and supply voltage. A SRAM device includes an array of individual SRAM cells implemented using metal oxide semiconductor (MOS) field effect transistors. In SRAM cells, butted contacts are used to connect one or more transistors to a first metal interconnect layer. Butted contacts are large contacts that enable connection of one or more gates to one or more active areas (i.e., source/drain structure) without the use of a horizontal metal interconnect layer. By using a single butted contact to connect to a gate and an active area, the size of a SRAM cell can be reduced.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
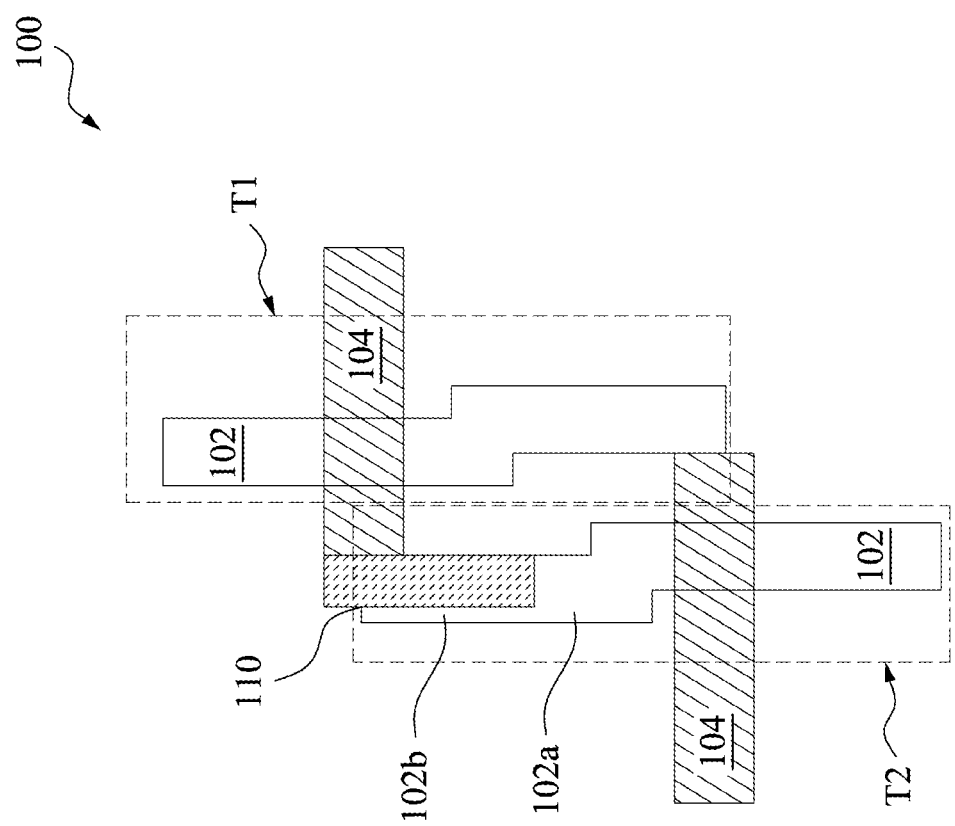
FIG. 1 is a semiconductor device arrangement for coupling of transistors using a butted contact, in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

A butted contact is widely used to connect a source/drain structure of a transistor to a gate structure of a neighboring transistor in SRAM. FIG. 1 illustrates a semiconductor device arrangement 100 using such butted contact 110 to couple a first transistor T1 and a second transistor T2, in accordance with some embodiments. Each of first and second transistors T1 and T2 includes an active region 102 and a gate structure 104 that extends over the active region 102. The butted contact 110 is formed to be in contact with both a gate structure 104 of the first transistor T1 and a source/drain structure 102a of the second transistor 102, and thus electrically couples the first transistor T1 to the second transistor T2.

To reduce butted contact resistance, dopants are implanted into the butted end of the source/drain structure 102a to form a butted contact region 102b over which the butted contact 110 is formed. Because the dopants in the butted contact region 102b has a conductivity type opposite to the conductivity type of dopants in the source/drain structure 102a of the transistor T2, a portion of the source/drain structures 102a adjacent to the gate structure 104 of the first transistor T1 needs to be masked with a patterned photoresist during the ion implantation process that forms the butted contact region 102b. The patterned photoresist is formed by applying a photoresist layer onto the substrate, exposing a photoresist layer to radiation through a photomask, and followed by etching away one of exposed or unexposed regions using a developer. Prior to applying the photoresist layer, the surfaces of the source/drain structures are chemically cleaned to remove contaminants. The commonly used cleaning solution is SPM which is a mixed solution of $H_2SO_4$ and $H_2O_2$. SPM has a strong oxidation capacity, and can form a relatively thick oxide layer on top of the source/drain structures 102a. The thick oxide layer tends to reflect a large amount of the light during the photoresist patterning process, forming notches (i.e., undercuts) on sidewalls of the patterned photoresist at the bottom portion of the patterned photoresist. During the subsequent ion implantation, the dopants can be implanted into the masked portions of source/drain structures through the notches on the sidewalls of the patterned photoresist, causing leakage of the butted contact 110. Leakage of the butted contact becomes an important reliability concern as the integrated circuits continue to scale down. Obtaining notch-free photoresist patterning profile thus is essential to improve reliability of the integrated circuits.

Accordingly, the present disclosure relates to cleaning methods which help to improve photoresist patterning profile. In some embodiments, after forming source/drain structures for a SRAM cell, the source/drain structures are cleaned with an ozone solution instead of a conventional SPM cleaning solution. The ozone solution reduces the thickness of native oxide formed on the source/drain structures, which helps to reduce the extent of the reflection from the native oxide during the patterning of the photoresist. As a result, the reflection-induced notching of the patterned photoresist is prevented. The elimination of the reflection-induced notching of the patterned photoresist helps to reduce the leakage of butted contacts formed in the SRAM cell. As a result, the device reliability is improved. Although the cleaning methods of the present disclosure are described for formation of butted contacts in SRAM cells, it should be noted that the cleaning methods of the present disclosure are applicable to any semiconductor fabrication processes when improved patterned photoresist profiles are needed.

Figure 2:
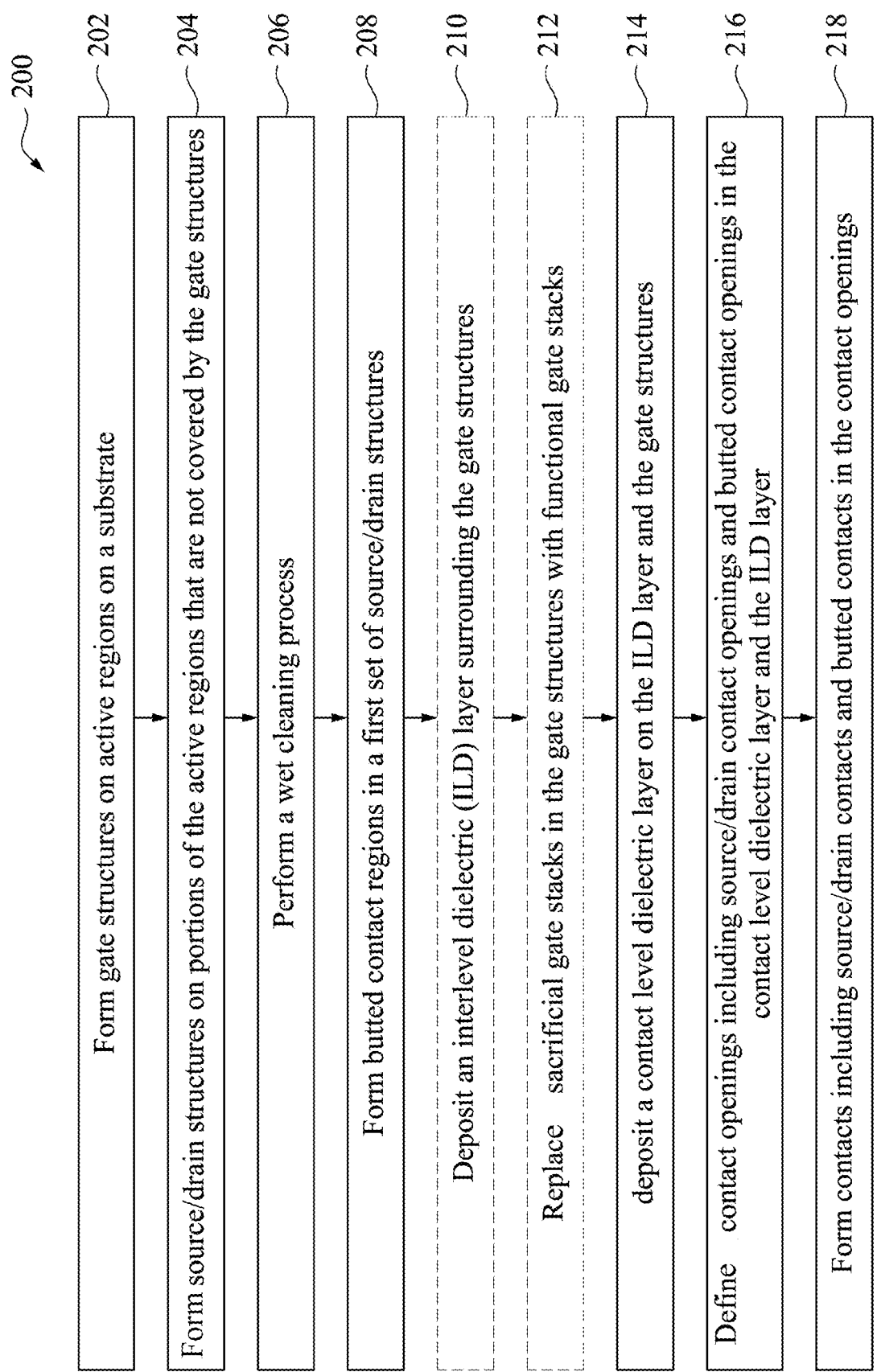
FIG. 2 is a flowchart of a method of fabricating a semiconductor structure, in accordance with some embodiments.

FIG. 2 is a flowchart of a method 200 of fabricating a semiconductor structure (e.g., a SRAM cell) 1100, in accordance with some embodiments of the present disclosure. FIGS. 3A-11B are various views of the semiconductor structure 1100 in various stages of the method 200, in accordance with some embodiments. The method 200 is discussed in detail below, with reference to the semiconductor structure 1100, in FIGS. 3A-11B. In some embodiments, additional operations are performed before, during, and/or after the method 200, or some of the operations described are replaced and/or eliminated. In some embodiments, additional features are added to the semiconductor structure 1100. In some embodiments, some of the features described below are replaced or eliminated. One of ordinary skill in the art would understand that although some embodiments are discussed with operations performed in a particular order, these operations may be performed in another logical order.

Figure 3A:
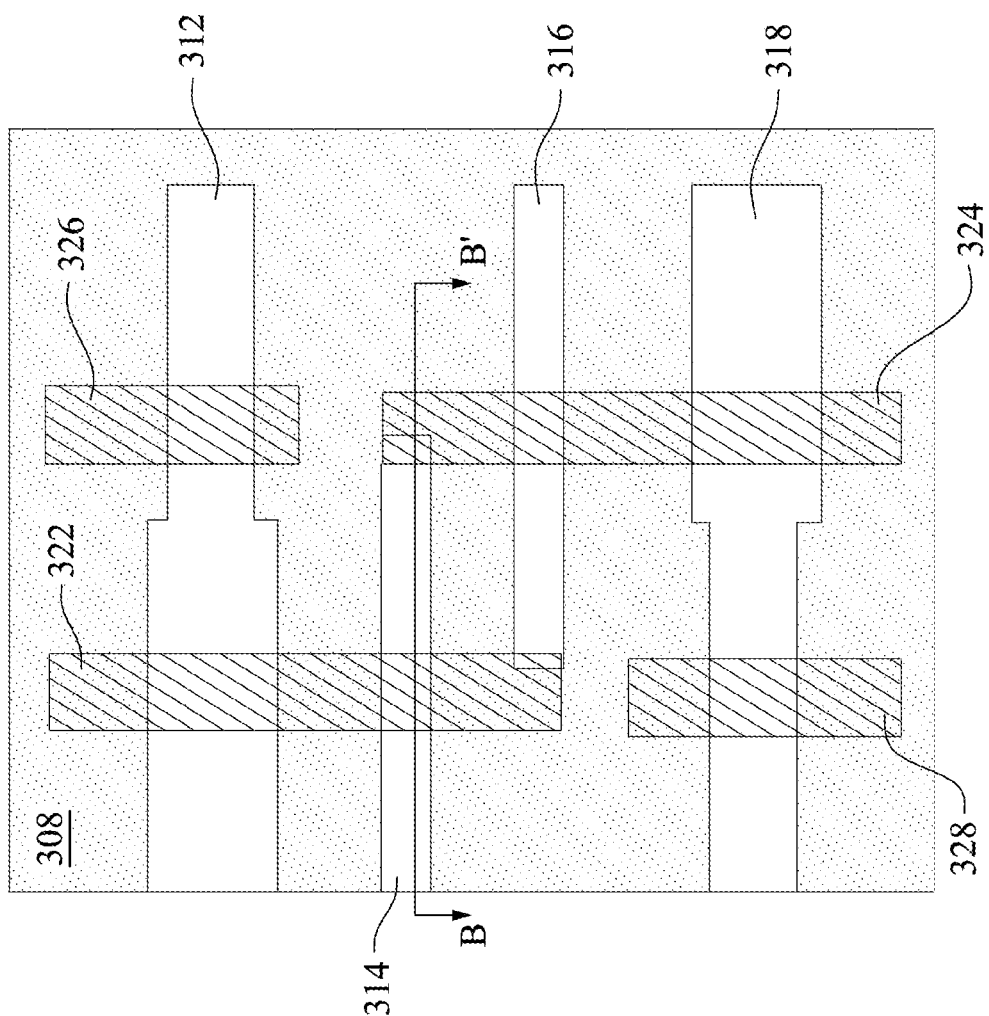
FIGS. 3A-11B are various views of the semiconductor structure in various stages of the method of FIG. 2, in accordance with some embodiments.
Figure 3B:
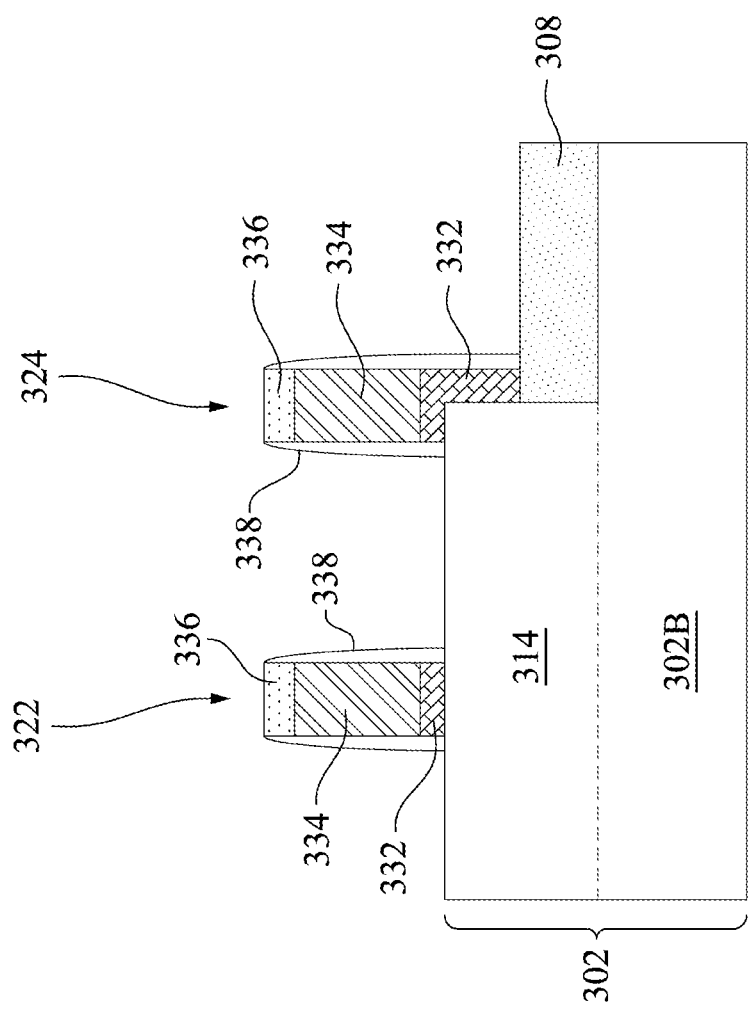

Referring to FIG. 2, the method 200 includes operation 202, in which gate structures 322, 324, 326, 328 are formed on respective active regions 312, 314, 316, 318 in accordance with some embodiments. FIG. 3A is a top view of a semiconductor structure following formation of the gate structures 322, 324, 326, 328 on respective active regions 312, 314, 316, 318. FIG. 3B is a cross-sectional view of the semiconductor structure of FIG. 3A taken along line B-B'.

Referring to FIGS. 3A and 3B, a substrate 302 is provided. In some embodiments, the substrate 302 is a bulk semiconductor substrate including a semiconductor material or a stack of semiconductor materials such as, for example, silicon (Si), germanium (Ge), silicon germanium (SiGe), carbon doped silicon (Si:C), silicon germanium carbon (SiGeC); or an III-V compound semiconductor such as, for example, gallium arsenide (GaAs), gallium phosphide (GaP), indium phosphide (InP), indium arsenide (InAs), indium antimonide (InSb), gallium arsenide phosphide (GaAsP), aluminum indium arsenide (AlInAs), aluminum gallium arsenide (AlGaAs), gallium indium arsenide (GaInAs), gallium indium phosphide (GaInP), or gallium indium arsenide phosphide (GaInAsP). In some embodiments, the bulk semiconductor substrate includes a single crystalline semiconductor material such as, for example, single crystalline silicon. In some embodiments, the bulk semiconductor substrate is doped depending on design requirements. In some embodiments, the bulk semiconductor substrate is doped with p-type dopants or n-type dopants. The term "p-type" refers to the addition of impurities to an intrinsic semiconductor that creates deficiencies of valence electrons. Exemplary p-type dopants, i.e., p-type impurities, include, but are not limited to, boron, aluminum, gallium, and indium. "N-type" refers to the addition of impurities that contribute free electrons to an intrinsic semiconductor. Exemplary n-type dopants, i.e., n-type impurities, include, but are not limited to, antimony, arsenic, and phosphorous. If doped, the substrate 302, in some embodiments, has a dopant concentration in a range from $1.0\times10^{14}$ atoms/cm$^3$ to $1.0\times10^{17}$ atoms/cm$^3$, although the dopant concentrations may be greater or smaller.

In some embodiments, the substrate 302 is a semiconductor-on-insulator (SOI) substrate including a top semiconductor layer formed on an insulator layer (not shown). The top semiconductor layer includes the above-mentioned semiconductor material such as, for example, Si, Ge, SiGe, Si:C, SiGeC; or an III-V compound semiconductor including GaAs, GaP, InP, InAs, InSb, GaAsP, AlInAs, AlGaAs, GaInAs, GaInP, or GaInAsP. The insulator layer is, for example, a silicon oxide layer, or the like. The insulator layer is provided over a base substrate, typically a silicon or glass substrate.

Isolation structures 308 are formed in substrate 302 to define various active regions. The active regions includes a first active region 312, a second active region 314, a third active region 316, and a fourth active region 318. In some embodiments, the first and fourth active regions 312, 318 are used for formation of n-type transistors, while the second and third active regions 314, 316 are used for formation of p-type transistors in a SRAM cell. In some embodiments, the active regions 312, 314, 316, 318 are intrinsic (i.e., undoped) semiconductor regions. In some embodiments, the first and fourth active regions 312, 318 where the n-type transistors are subsequently formed are doped with p-type dopants, and the second and third active regions 314, 316 where the p-type transistors are subsequently formed are doped with n-type dopants. In some embodiments, the active regions 312, 314, 316, 318 are planar regions formed in an upper portion of the substrate 302 for formation of planar FETs (not shown). In some other embodiments, and as in FIG. 3B, the active regions 312, 314, 316, 318 are semiconductor fins that are raised from a base portion 302B of the substrate 302 for formation of FinFETs. In some embodiments, the semiconductor fins are formed by lithography and etching. In some embodiments, a photoresist layer (not shown) is applied on substrate 302 and patterned to provide a patterned photoresist layer atop the substrate 302. The pattern in the patterned photoresist layer is then transferred into the substrate 302 by an anisotropic etch to provide semiconductor fins. In some embodiments, the etching process used for pattern transfer includes a dry etch such as, for example, reactive ion etch (RIE), plasma etch, ion beam etch or laser ablation. After transferring the pattern into the substrate 302, the patterned photoresist layer is removed utilizing a resist stripping process such as, for example, ashing. In some embodiments, other methods such as sidewall image transfer (SIT) or directional self-assembly (DSA) are used to form semiconductor fins. In still some other embodiments, the active regions 312, 314, 316, 318 are semiconductor nanosheets such as nanowires for formation of nanowire FETs (not shown).

In some embodiments, the isolation structures 308 are shallow trench isolation (STI) structures. Formation of the isolation structures 308 includes etching trenches (not shown) in the substrate 302 and filling the trenches with one or more insulator materials such as silicon dioxide, silicon nitride, or silicon oxynitride. In some embodiments, one or more isolation structures 308 have a multi-layer structure including a thermal oxide liner and silicon nitride filling the trench. In some embodiments, trenches are formed by applying a photoresist layer (not shown) on the substrate 302, lithographically patterning the photoresist layer, and transferring the pattern in the photoresist layer into an upper portion of the substrate 302 using an anisotropic etch such as RIE or plasma etch. Insulator materials are then deposited to fill the trenches using, for example, chemical vapor deposition (CVD), physical vapor deposition (PVD), or atomic layer deposition (ALD). Next, a chemical mechanical planarization (CMP) process is performed to polish back excessive insulator materials and planarize top surfaces of the isolation structures 308. In some embodiments, isolation structures 308 are formed by oxidizing or nitriding portions of substrate 302. In instances where active regions 312, 314 316 and 318 are semiconductor fins, the insulator materials are etched back to physically expose upper portions of the semiconductor fins. In some embodiments, a wet etch employing an etching chemical such as, for example, dilute hydrofluoric acid, may be used to etch the insulator materials. Accordingly, the isolation structures 308 surround bottom portions of semiconductor fins.

The gate structures 322, 324, 326, 328 are formed over the substrate 302. A first gate structure 322 is disposed to extend across the active regions 312, 314. A second gate structure 324 is disposed to extend across the active regions 316 and 318. A third gate structure 326 is disposed on the active region 312. A fourth gate structure 328 is disposed on the active region 318. Each of the gate structures 322, 324, 326, 328 includes a gate stack and gate spacers 338 on sidewalls of the gate stack. In some embodiments, the gate stack includes, from bottom to top, a gate dielectric 332, a gate electrode 334, and a gate cap 336.

In some embodiments, the gate stacks (332, 334, 336) are formed by providing a gate material stack (not shown) including a gate dielectric layer, a gate electrode layer, and a gate cap layer on the substrate 302, and lithographically patterning the gate material stack.

In some embodiments, the gate dielectric layer is on the substrate 302 and includes a dielectric material such as, for example, silicon oxide, silicon nitride, or silicon oxynitride. In some embodiments, the gate dielectric layer includes a high-k dielectric material having a dielectric constant greater than silicon oxide. Exemplary high-k dielectric materials include, but are not limited to, hafnium oxide ($HfO_2$), zirconium oxide ($ZrO_2$), lanthanum oxide ($La_2O_3$), aluminum oxide ($Al_2O_3$), titanium oxide ($TiO_2$), strontium titanium oxide ($SrTiO_3$), lanthanum aluminum oxide ($LaAlO_3$), and yttrium oxide ($Y_2O_3$). In some embodiments, the gate dielectric layer is formed utilizing a deposition process such as, for example, CVD, plasma enhanced chemical vapor deposition (PECVD), ALD, or PVD. In some embodiments, the gate dielectric layer is formed by conversion of a surface portion of the active regions 312, 314, 316, 318 utilizing thermal oxidation or nitridation.

The gate electrode layer is on the gate dielectric layer. In some embodiments, the gate electrode layer includes a semiconductor material such as polysilicon. In some embodiments, the gate electrode layer includes a conductive metal such as, for example, tungsten (W), copper (Cu), aluminum (Al), cobalt (Co), or alloys thereof. In some embodiments, the gate electrode layer is formed by a suitable deposition process such as, for example, CVD, PECVD, ALD, or PVD.

The gate cap layer is on the gate electrode layer. In some embodiments, the gate cap layer includes a dielectric material such as, for example, silicon oxide, silicon nitride, or silicon oxynitride. In some embodiments, the gate cap layer is formed utilizing a deposition process such as, for example, CVD, PECVD, ALD, or PVD.

In some embodiments, the gate material stack is patterned by lithography and etching. For example, a photoresist layer (not shown) is applied over the topmost surface of the gate material stack and lithographically patterned by lithographic exposure and development. The pattern in the photoresist layer is sequentially transferred into the gate material stack by at least one anisotropic etch. The anisotropic etch is a dry etch, for example RIE, a wet etch, or a combination thereof. If not completely consumed, the remaining photoresist layer after formation of the gate material stack is removed by, for example, ashing.

In some embodiments the gate structures 322, 324, 326, 328 are sacrificial gate structures in which the gate stacks (332, 334, 336) are sacrificial gate stacks. The sacrificial gate stacks are replaced later by functional gate stacks. The term "sacrificial gate stack" is used throughout the present disclosure to denote a material stack that serves as a placeholder for a functional gate stack to be subsequently formed. The term "functional gate stack" as used herein refers to a permanent gate stack used to control output current (i.e., flow of carriers in the channel) of a semiconducting device through electrical fields.

After formation of gate stacks (332, 334, 336), the gate spacers 338 are formed on sidewalls of the gate stacks (332, 334, 336). In some embodiments, the gate spacers 338 include a dielectric material such as a dielectric oxide, a dielectric nitride, a dielectric oxynitride, or combinations thereof. In some embodiments, the gate spacers 338 include silicon nitride. In some embodiments, the gate spacers 338 are formed by depositing a gate spacer material layer (not shown) on exposed surfaces of the gate stacks (332, 334, 336) and the substrate 302 and etching the gate spacer material layer to remove horizontal portions of the gate spacer material layer. In some embodiments, the gate spacer material layer is provided by a suitable deposition process including, for example, CVD, PECVD or ALD. The etching of the gate spacer material layer is performed by a dry etch such as, for example, ME. Remaining vertical portions of the gate spacer material layer on the sidewalls of the gate stacks (332, 334, 336) constitute the gate spacers 338.

Figure 4A:
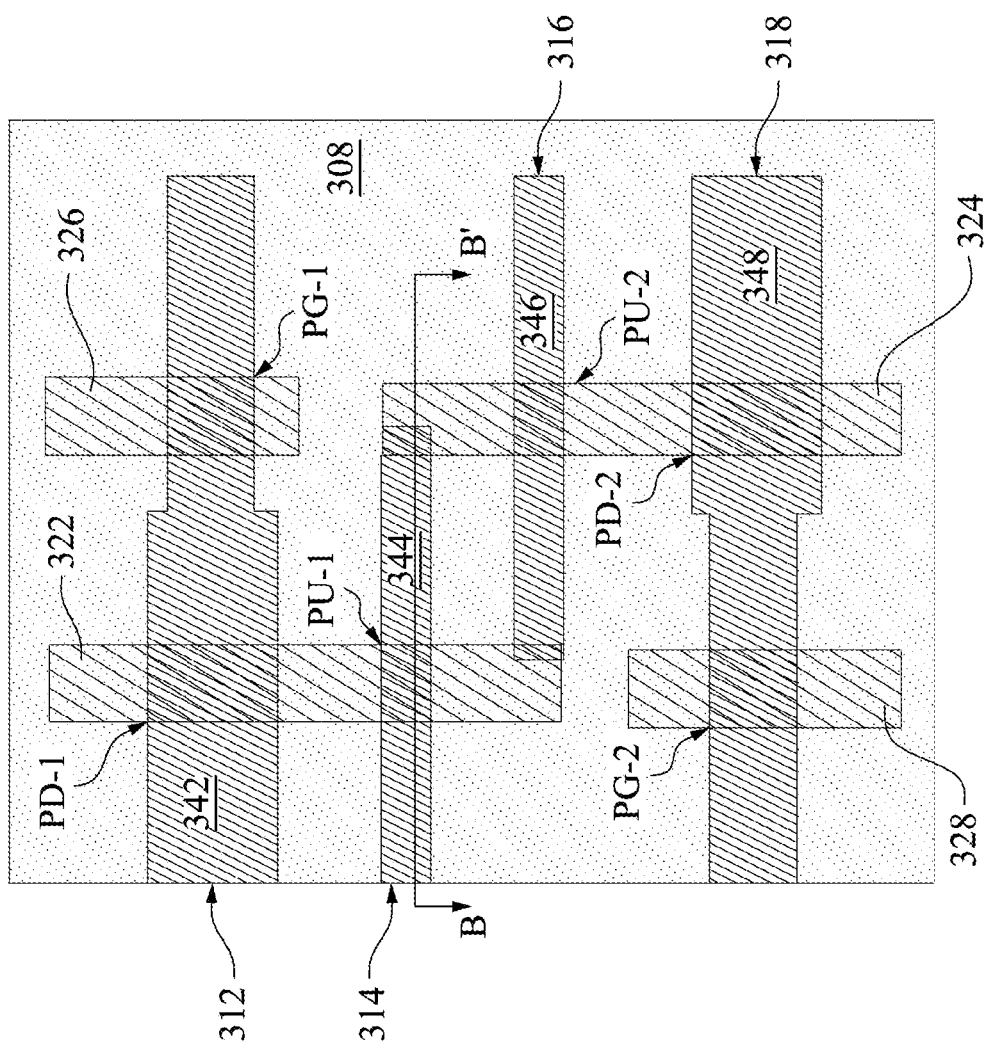
Figure 4B:
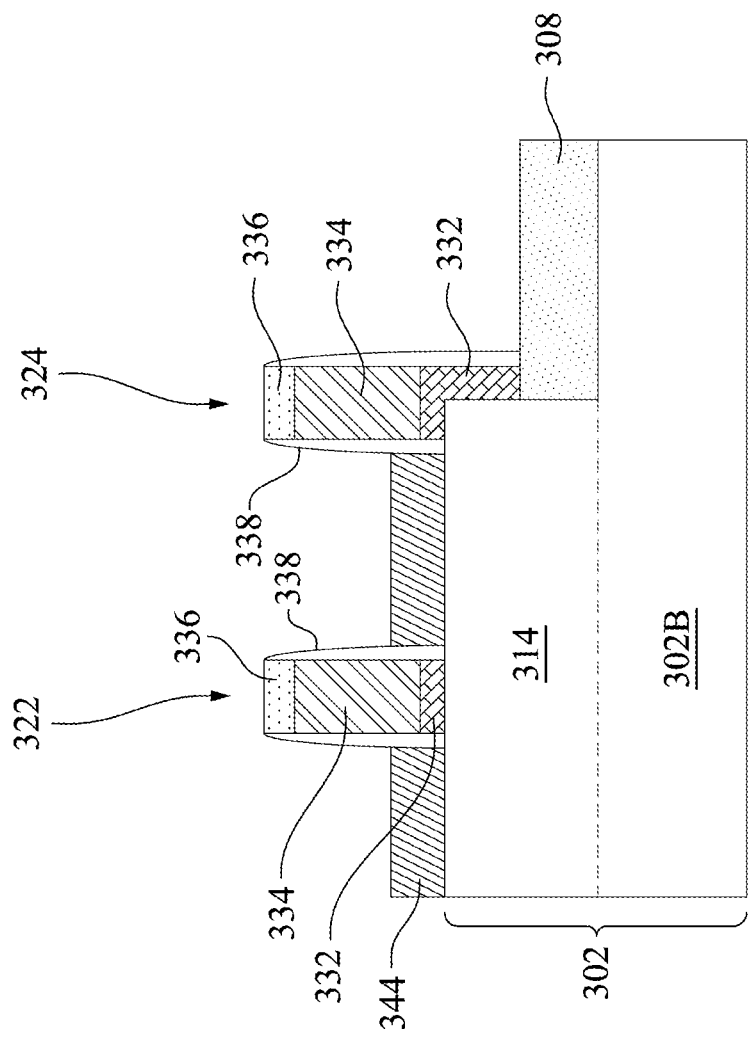

Referring to FIG. 2, the method 200 includes operation 204, in which source/drain structures 342, 344, 346, 348 are formed on portions of respective active regions 312, 314, 316, 318 that are not covered by the gate structures 322, 324, 326, 328, in accordance with some embodiments. FIG. 4A is a top view of the semiconductor structure of FIGS. 3A and 3B after formation of the source/drain structures 342, 344, 346, 348 on the portions of respective active regions 312, 314, 316, 318 that are not occupied by the gate structures 322, 324, 326, 328. FIG. 4B is a cross-sectional view of the semiconductor structure of FIG. 4A taken along line B-B'.

Referring to FIGS. 4A and 4B, source/drain structures 342, 344, 346, 348 includes first source/drain structures 342 formed on the portions of the first active region 312 that are not covered by the first and third gate structures 322, 326, second source/drain structures 344 formed on the portions of the second active region 314 that are not covered by the first gate structure 322, third source/drain structures 346 formed on the portions of the third active region 316 that are not covered by the second gate structure 324, and fourth source/drain structures 348 formed on the portions of the fourth active region 318 that are not covered by the second and fourth gate structures 324, 328. Here, a source/drain structure functions as either a source or a drain depending on the wiring of transistors.

The source/drain structures 342, 344, 346, 348 are doped semiconductor structures. In some embodiments, the source/drain structures 342, 344, 346, 348 independently include a semiconductor material such as, for example, Si, SiGe, Si:C, Ge, or an III-V material such as GaAs, InP, GaP, or GaN. The source/drain structures 342, 344, 346, 348 contains dopants of appropriate conductivity types. For example, the first and fourth source/drain structures 342, 348 may contain n-type dopants for formation of n-type transistors, while the second and third source/drain structures 344, 346 may contain p-type dopants for formation of p-type transistors for a SRAM cell. The dopant concentration in the source/drain structures 342, 344, 346, 348 can be from about $1\times10^{19}$ atoms/cm$^3$ to about $2\times10^{21}$ atoms/cm$^3$, although lesser or greater dopant concentrations are also contemplated.

In some embodiments, the source/drain structures 342, 344, 346, 348 are epitaxial layers formed by one or more selective epitaxial growth processes. During a selective epitaxial growth, the deposited semiconductor material grows only on exposed semiconductor surfaces, such as surfaces of the active regions 312, 314, 316, 318, but does not grow on dielectric surfaces, such as the surfaces of the isolation structures 308, the gate caps 336, and the gate spacers 338. In some embodiments, when the active regions 312, 314, 316, 318 are semiconductor fins, the deposited semiconductor material grows on sidewalls and top surfaces of the semiconductor fins. In some embodiments, the source/drain structures 342, 344, 346, 348 are formed by molecular beam epitaxy (MBE).

In some embodiments, the source/drain structures 342, 344, 346, 348 are in-situ doped with dopants of appropriate conductivity type, n-type or p-type, during the epitaxial growth processes. In some embodiments, the source/drain structures 342, 344, 346, 348 are doped (ex-situ) after the epitaxial growth process utilizing, for example, ion implantation. For example, to form n-type transistors in the active regions 312 and 318, n-type dopants such as phosphorus or arsenic are implanted into the deposited semiconductor material on the active regions 312 and 318, while the active regions 314 and 316 are covered by a mask. Similarly, to form p-type transistors in the active regions 314 and 316, p-type dopants such as boron or $BF_2$ are implanted into the deposited semiconductor material on the active regions 314 and 316, while the active regions 312 and 318 are covered by a mask.

Alternatively, in some embodiments, the source/drain structures 342, 344, 346, 348 are formed by implanting dopants of appropriate types into the portions of corresponding active regions 312, 314, 316, 318 not covered by the gate structures 322, 324, 326, 328.

In some embodiments, the source/drain structures 342, 344, 346, 348 are further exposed to an annealing process to activate the dopants in the source/drain structures 342, 344, 346, 348 after forming the source/drain structures 342, 344, 346, 348 and/or after the subsequent doping process. In some embodiments, the dopants in the source/drain structures 342, 344, 346, 348 are activated by a thermal annealing process including a rapid thermal annealing process, a laser annealing process, or a furnace annealing process. In some embodiments, the dopants in the source/drain structures 342, 344, 346, 348 are diffused into the underlying corresponding active regions 312, 314, 316, 318 to dope surface portions of the corresponding active regions 312, 314, 316, 318.

Various transistors for a SRAM cell are thus formed. The transistors include a first pull-up transistor PU-1 and a first pull-down transistor PD-1 for constructing a first invertor for the SRAM cell, a second pull-up transistor PU-2 and a second pull-down transistor PD-2 for constructing a second invertor for the SRAM cell, and a first pass-gate transistor PG-1 and a second pass-gate transistor PG-2.

The first pull-up transistor PU-1 includes a first portion of the gate structure 322 over a portion of the active region 314 and source/drain structures 344 on opposite sides of the first portion of the gate structure 322. The second pull-up transistor PU-2 includes a first portion of the gate structure 324 over a portion of the active region 316 and source/drain structures 346 on opposite sides of the first portion of the gate structure 324.

The first pull-down transistor PD-1 includes a second portion of the gate structure 322 over a first portion of the active region 312 and source/drain structures 342 on opposite sides of the second portion of the gate structure 322. The second pull-down transistor PD-2 includes a second portion of the gate structure 324 over a first portion of the active region 318 and source/drain structures 348 on opposite sides of the second portion of the gate structure 324. The first pull-down transistors PD-1 and the first pull-up transistor PU-1 thus share a common gate structure (i.e., gate structure 322), while the second pull-down transistors PD-2 and the second pull-up transistor PU-2 share a common gate structure (i.e., gate structure 324).

The first pass-gate transistor PG-1 includes the gate structure 326 over a second portion of the active region 312 and source/drain structures 342 on opposite sides of the gate structure 326. In some embodiments, the first pass-gate transistor PG-1 and the first pull-down transistor PD-1 share a common source/drain structure 342 located between the gate structures 322 and 326. The second pass-gate transistor PG-2 includes the gate structure 328 over a second portion of the active region 318 and source/drain structures 348 on opposite sides of the gate structure 328. In some embodiments, the second pass-gate transistor PG-2 and the second pull-down transistor PD-2 share a common source/drain structure 348 located between the gate structures 324 and 328.

Figure 5A:
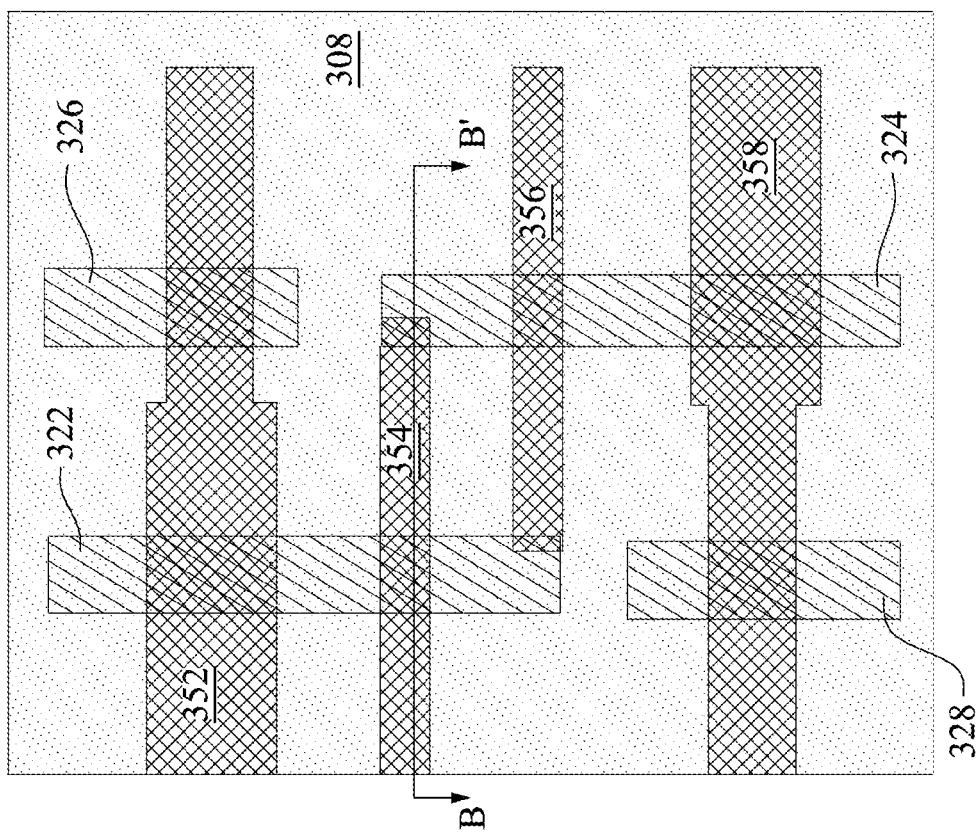
Figure 5B:
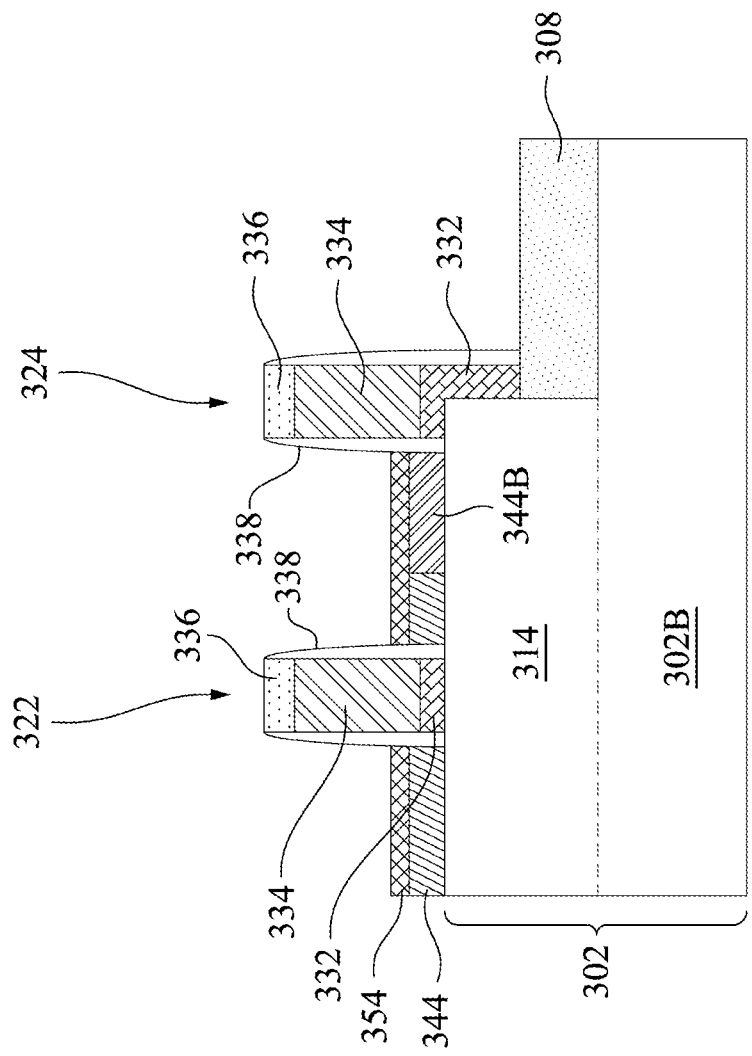

Referring to FIG. 2, the method 200 proceeds to operation 206, in which a wet cleaning process is performed to remove contaminants from the source/drain structures 342, 344, 346, 348, in accordance with some embodiments. FIG. 5A is a top view of the semiconductor structure of FIGS. 4A and 4B after the cleaning process. FIG. 5B is a cross-sectional view of the semiconductor structure of FIG. 5A taken along line B-B'.

In some embodiments, a cleaning solution comprising ozone (03) and deionized water (DIW) is applied to the source/drain structure 342, 344, 346, 348 to clean the surfaces of the source/drain structures 342, 344, 346, 348, thereby removing any contaminants from the surfaces of the source/drain structures 342, 344, 346, 348. In some embodiments, the cleaning solution consists essentially of ozone and DIW. The concentration of ozone in the cleaning solution can be from about 20 parts per million (ppm) to about 70 ppm. In some embodiments, the concentration of ozone in the ozone solution is about 50 ppm. If the concentration of ozone is too low, the source/drain structures may not be sufficiently cleaned of contaminants. If the concentration of ozone is too high, the thickness of oxide layers formed by ozone oxidation of the source/drain structures is too great, which leads to formation of notches on sidewalls of the patterned photoresist. The ozone wet cleaning process is carried out at temperatures in the range of about 15° C. to about 40° C. In some embodiments, the ozone wet cleaning process is carried out at room temperature, for example, about 25° C. If the cleaning temperature is too low, the source/drain structures may not be sufficiently cleaned of contaminants. If the cleaning temperature is too high, the thickness of oxide layers formed by ozone oxidation of the source/drain structures is too great, which leads to formation of notches on sidewalls of the patterned photoresist. The cleaning time can be controlled from about 5 seconds to about 20 seconds. In some embodiments, the ozone wet cleaning process is conducted for about 10 seconds. If the cleaning time is too short, the source/drain structures may not be sufficiently cleaned of contaminants. If the cleaning time is too long, the thickness of oxide layers formed by ozone oxidation of the source/drain structures is too great, which leads to formation of notches on sidewalls of the patterned photoresist. In the cleaning process, the ozone solution can be sprayed onto the surfaces of the source/drain structures 342, 344, 346, 348. Alternatively, the surfaces of the source/drain structures 342, 344, 346, 348 can be brought into contact with the ozone solution by immersing the semiconductor structure of FIGS. 5A and 5B in a vessel containing the ozone solution.

Cleaning the surfaces of the source/drain structures 342, 344, 346, 348 using the ozone-containing solution also oxidizes the surfaces of the source/drain structures 342, 344, 346, 348, forming oxide layers 352, 354, 356, 358 on respective source/drain structures 342, 344, 346, 348. In instances where the source/drain structures 342, 344, 346, 348 include SiGe, the oxide layers 352, 354, 356, 358 include silicon oxide. The thickness of the oxide layers 352, 354, 356, 358 formed can be from about 0.1 angstroms (Å) to about 0.4 Å. In some embodiments, the thickness of the oxide layers 352, 354, 356, 358 is about 0.26 Å. If the thickness of the oxide layers is too great, the reflective notching in the patterned photoresist is likely induced.

Comparing to the conventional cleaning process using a sulphate/peroxide mixture (SPM) including sulfuric acid ($H_2SO_4$) and hydrogen peroxide ($H_2O_2$) at a relatively high temperature about 90° C., the low temperature ozone cleaning process helps to form oxide layers having a thickness of less than half of the thickness of oxide layers formed by the SPM cleaning process. The relative thin oxide layer causes less light to be reflected during the subsequent photoresist patterning process. The ozone cleaning process thus helps to prevent formation of necking on sidewalls of the patterned photoresist at the interfaces with the oxide layers.

Figure 6A:
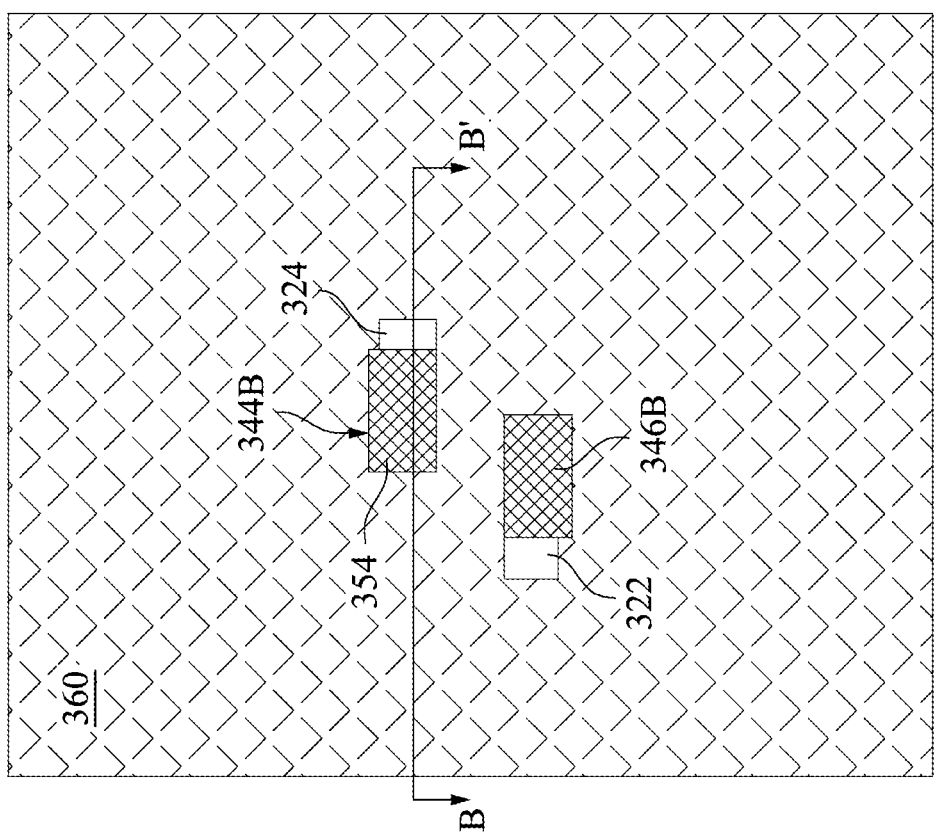
Figure 6B:
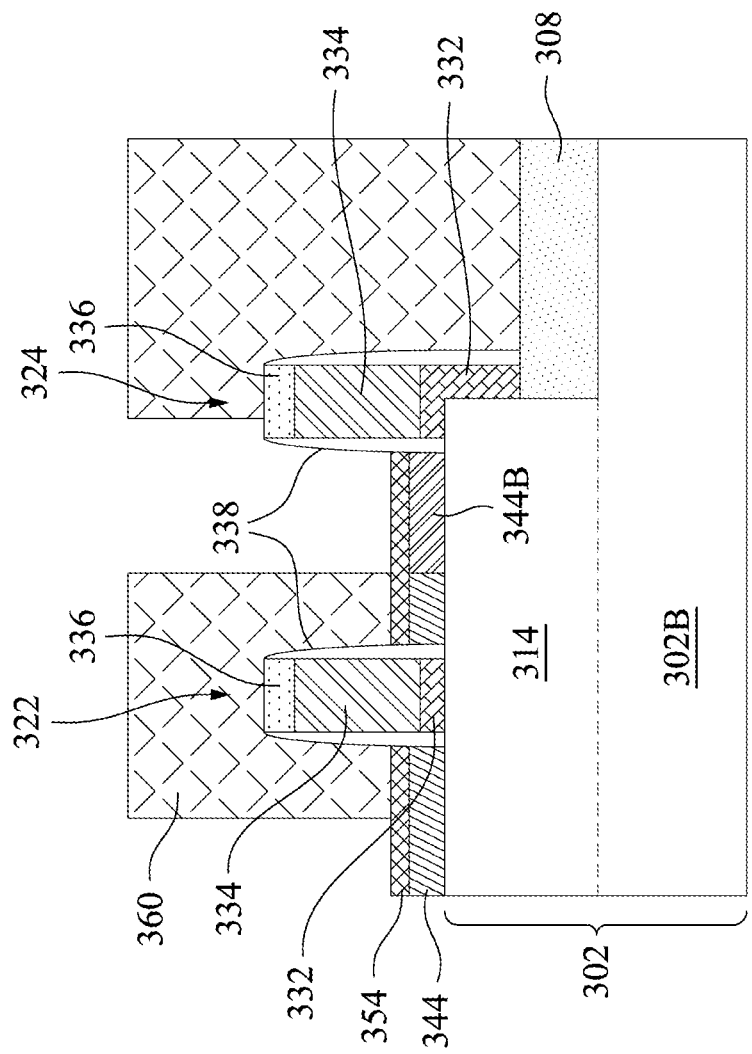

Referring to FIG. 2, the method 200 proceeds to operation 208, in which butted contact regions 344B, 346B are formed in butted ends of respective source/drain structures 344, 346, in accordance with some embodiments. FIG. 6A is a top view of the semiconductor structure of FIGS. 5A and 5B after forming the butted contact regions 344B, 346B in the butted ends of respective source/drain structures 344, 346. FIG. 6B is a cross-sectional view of the semiconductor structure of FIG. 6A taken along line B-B'.

Referring to FIGS. 6A and 6B, a patterned photoresist layer 360 is formed to cover portions of the source/drain structures 344, 346 adjacent to the respective gate structures 322, 324, while exposing portions of the source/drain structures 344, 346 distal from the respective gate structures 322, 324. The patterned photoresist layer 360 is formed by applying a photoresist layer (not shown) over the substrate 302, exposing the photoresist layer to light with a predetermined pattern, performing post-exposure baking, and developing the photoresist. Because the oxide layers 354, 356 are made to have thin thickness, the thin oxide reduces scattering and reflection of the light during exposure of photoresist, thereby eliminating or minimizing formation of reflection-induced notching at the bottom of the photoresist. The resulting sidewall profile of the patterned photoresist layer 360 is substantially straight, uniform and devoid of a necking or notched configuration.

Subsequently, dopants are implanted into the exposed portions of the source/drain structures 344, 346 using the patterned photoresist layer 360 as an ion implantation mask, forming butted contact regions 344B in the source/drain structure 344, and butted contact regions 346B in the source/drain structure 346. The implanted dopants have a conductivity different from the dopants in the source/drain structures 344, 346. For example, when the source/drain structures 344, 346 are doped with p-type dopants, n-type dopants are implanted in the exposed portions of the source/drain structures 344, 346, and vice versa. Because the patterned photoresist layer 360 is free of necking defects, the risk of implanting dopants into the portions of the source/drain structures 344, 346 that are covered by the patterned photoresist layer 360 through the notch is eliminated. As a result, each butted contact region 344B, 346B forms a sharp, abrupt junction with the corresponding source/drain structures 344, 346.

After the ion implantation, the patterned photoresist layer 360 is removed by, for example, ashing.

In some embodiments, a wet cleaning process using, for example, SPM, is performed to remove the residue of the patterned photoresist layer 360. In some embodiments, the cleaning process also removes the oxide layers 352, 354, 356, 358. The surfaces of the source/drain structures 342, 344, 346, and 348 are physically exposed (not shown). In other embodiments, the oxide layers 352, 354, 356, 358 remain in the structure after the photoresist cleaning process.

Figure 7A:
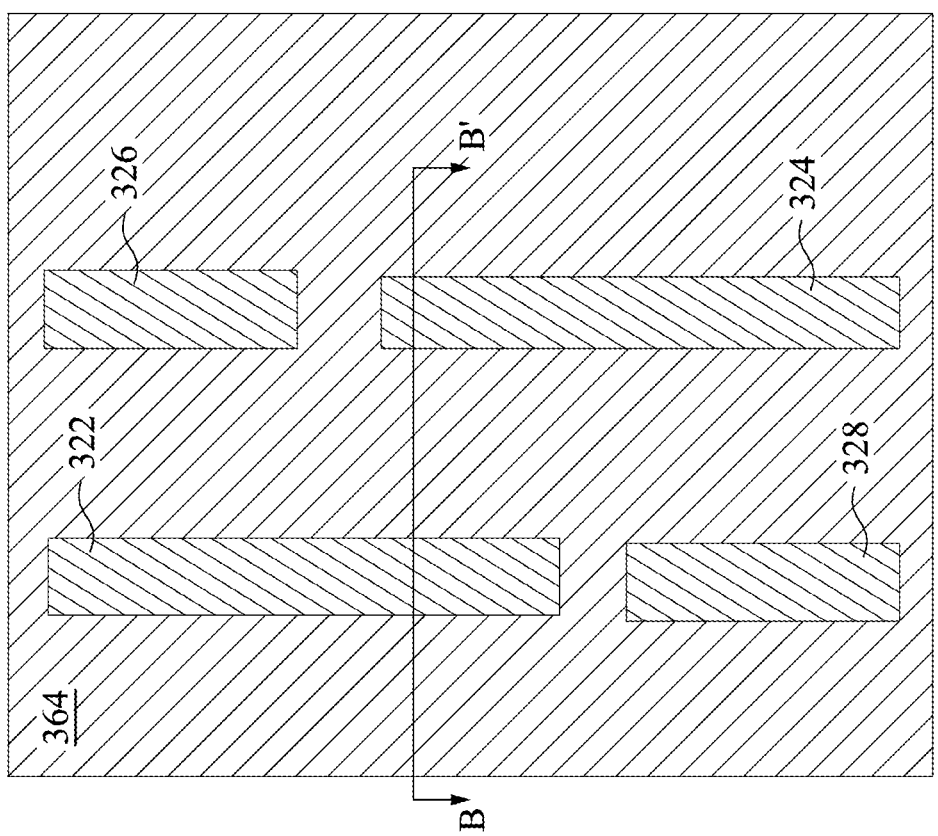
Figure 7B:
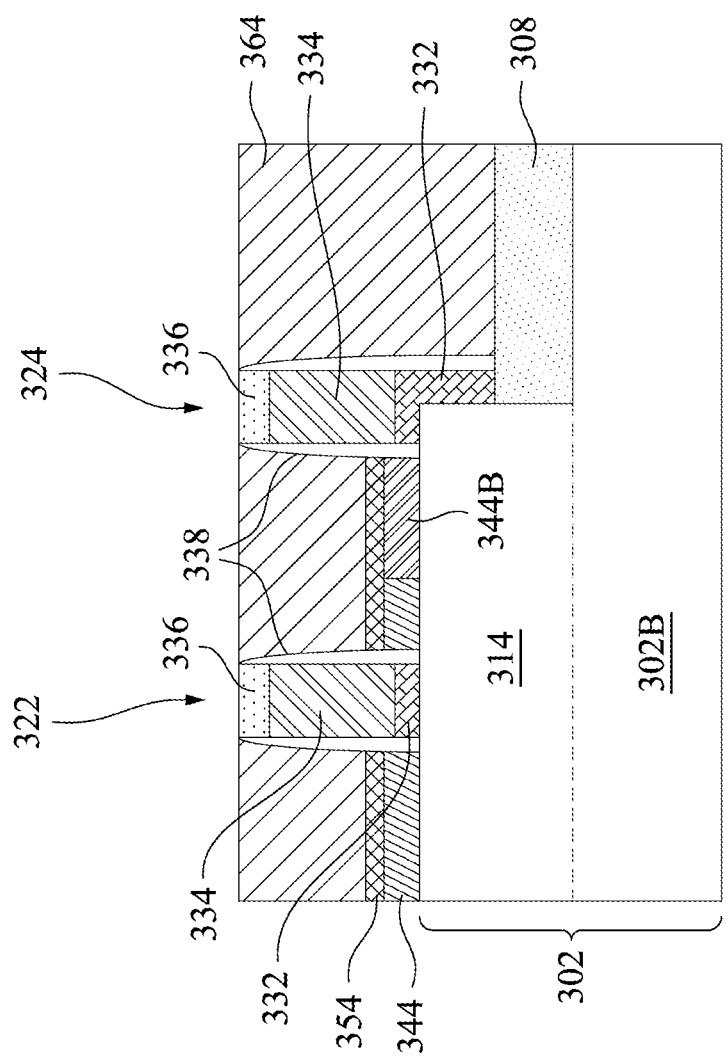

Referring to FIG. 2, the method 200 proceeds to operation 210 in instances where the gate stacks (332, 334, 336) are sacrificial gate stacks. In operation 210, an interlevel dielectric (ILD) layer 364 is deposited on the substrate 302, in accordance with some embodiments. FIG. 7A is a top view of the semiconductor structure of FIGS. 6A and 6B after forming the ILD layer 364 over the substrate 302. FIG. 7B is a cross-sectional view of the semiconductor structure of FIG. 7A taken along line B-B'.

Referring to FIGS. 7A and 7B, the ILD layer 364 is deposited over the substrate 302, surrounding the gate structures 322, 324, 326 and 328. The ILD layer 364 fills in gaps between the gate structures 322, 324, 326 and 328. In some embodiments, the ILD layer 364 includes silicon oxide. Alternatively, in some embodiments, the ILD layer 364 includes a low-k dielectric material having a dielectric constant (k) less than 4. In some embodiments, the low-k dielectric material has a dielectric constant from about 1.2 to about 3.5. In some embodiments, the ILD layer 364 includes tetraethylorthosilicate (TEOS) oxide, undoped silicate glass, or doped silicate glass such as borophosphosilicate glass (BPSG), fluorosilica glass (FSG), phosphosilicate glass (PSG), boron doped silicon glass (BSG), and/or other suitable dielectric materials. In some embodiments, the ILD layer 364 is deposited by CVD, PECVD, PVD, or spin coating. In some embodiments, the ILD layer 364 is deposited to have a top surface above the topmost surfaces of the gate structure 322, 324, 326 and 328 (e.g., the top surface of the gate caps 336). The ILD layer 364 is subsequently planarized, for example, by CMP and/or a recess etch using the gate cap 336 as a polishing and/or etch stop. After the planarization, the ILD layer 364 has a surface coplanar with the topmost surfaces of the gate structures 322, 324, 326 and 328.

Figure 8A:
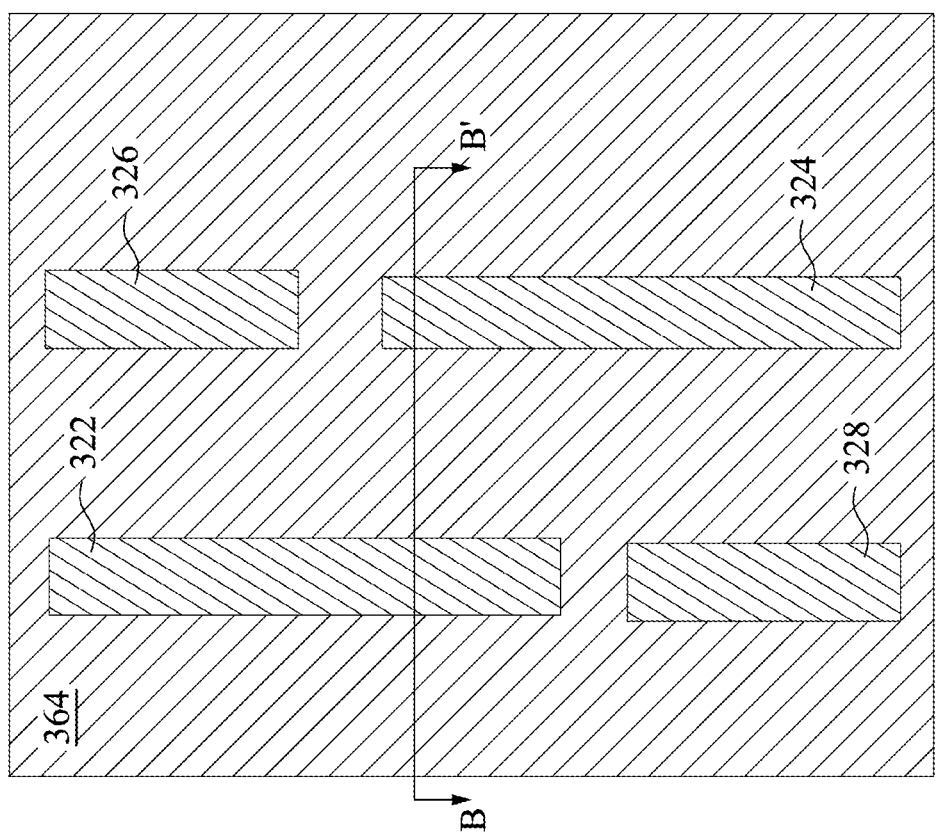
Figure 8B:
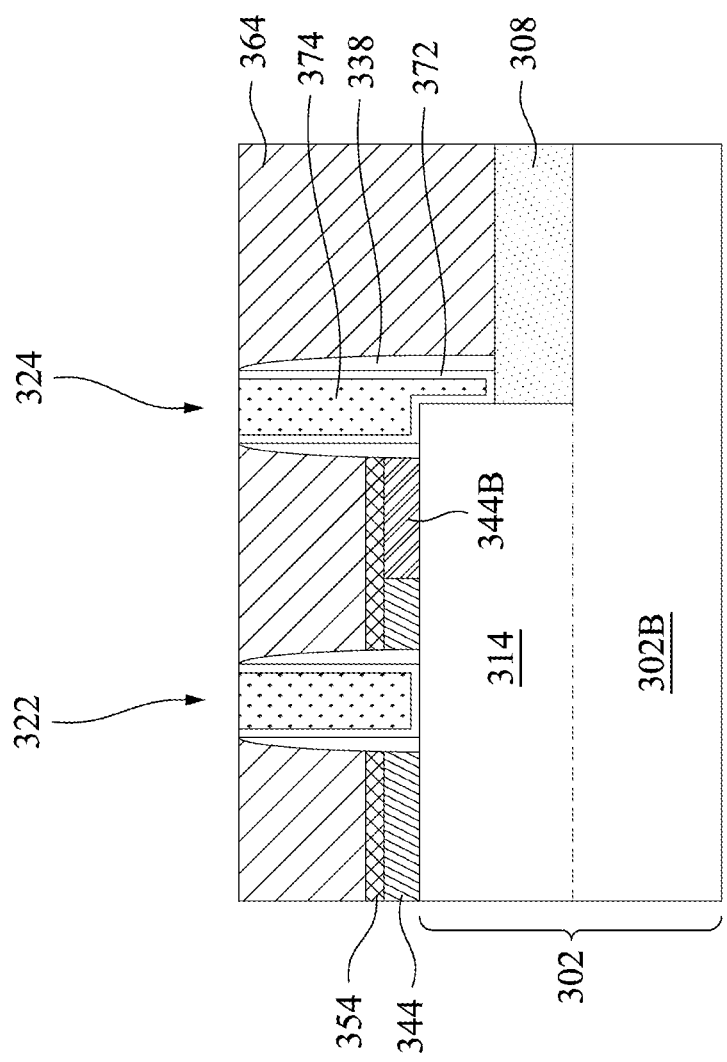

Referring to FIG. 2, the method 200 proceeds to operation 212, in which the gate stacks (332, 334, 336) are replaced with functional gate stacks (372, 374), in accordance with some embodiments. FIG. 8A is a top view of the semiconductor structure of FIGS. 7A and 7B after replacing the gate stacks (332, 334, 336) with the functional gate stacks (372, 374). FIG. 8B is a cross-sectional view of the semiconductor structure of FIG. 8A taken along line B-B'.

Referring to FIGS. 8A and 8B, each of the functional gate stacks (372, 374) includes a U-shaped gate dielectric 372 and a gate electrode 374 surrounded by the gate dielectric 372. In some embodiments, the gate dielectric 372 includes a high-k dielectric material having a dielectric constant greater than silicon oxide. Exemplary high-k dielectric materials include, but are not limited to, $HfO_2$, $ZrO_2$, $La_2O_3$, $Al_2O_3$, $TiO_2$, $SrTiO_3$, $LaAlO_3$, and $Y_2O_3$. In some embodiments, a multilayered gate dielectric structure comprising different gate dielectric materials, e.g., silicon oxide, and a high-k gate dielectric is formed. In some embodiments, the gate electrode 374 includes a conductive metal such as, for example, W, Cu, Al, Co, or alloys thereof.

To form the functional gate stacks (372, 374), the gate stacks (332, 334, 336) are first removed to provide gate cavities (not shown). The various components of the gate stacks (332, 334, 336) can be removed selectively to the active regions 312, 314, 316 and 318, the gate spacers 338, and the ILD layer 364 by at least one etch. The at least one etch can be a wet chemical etch such as an ammonia etch or a dry etch such as RIE. Each gate cavity occupies a volume from which a corresponding gate stack (332, 334, 336) is removed and is laterally confined by inner sidewalls of the gate spacer 338.

Subsequently, a conformal dielectric layer (not shown) is deposited on bottom surfaces and sidewalls of the gate cavities and on the top surface of the ILD layer 364. In some embodiments, the gate dielectric layer is deposited by, for example, CVD or ALD. A gate electrode layer (not shown) is then deposited on the gate dielectric layer to fill remaining volumes of the gate cavities. In some embodiments, the gate electrode layer is deposited by, for example, CVD, PECVD, or ALD. A planarization process, such as CMP is performed to remove portions of the gate electrode layer and the gate dielectric layer from the top surface of the ILD layer 364. The remaining portion of the gate electrode layer within each gate cavity constitutes the gate electrode 374, and the remaining portion of the gate dielectric layer within each gate cavity constitutes the gate dielectric 372.

In some embodiments, when the gate stacks (332, 334, 336) in the gate structures 322, 324, 326, 328 are functional gate stacks, operations 212 and 214 are omitted.

Figure 9A:
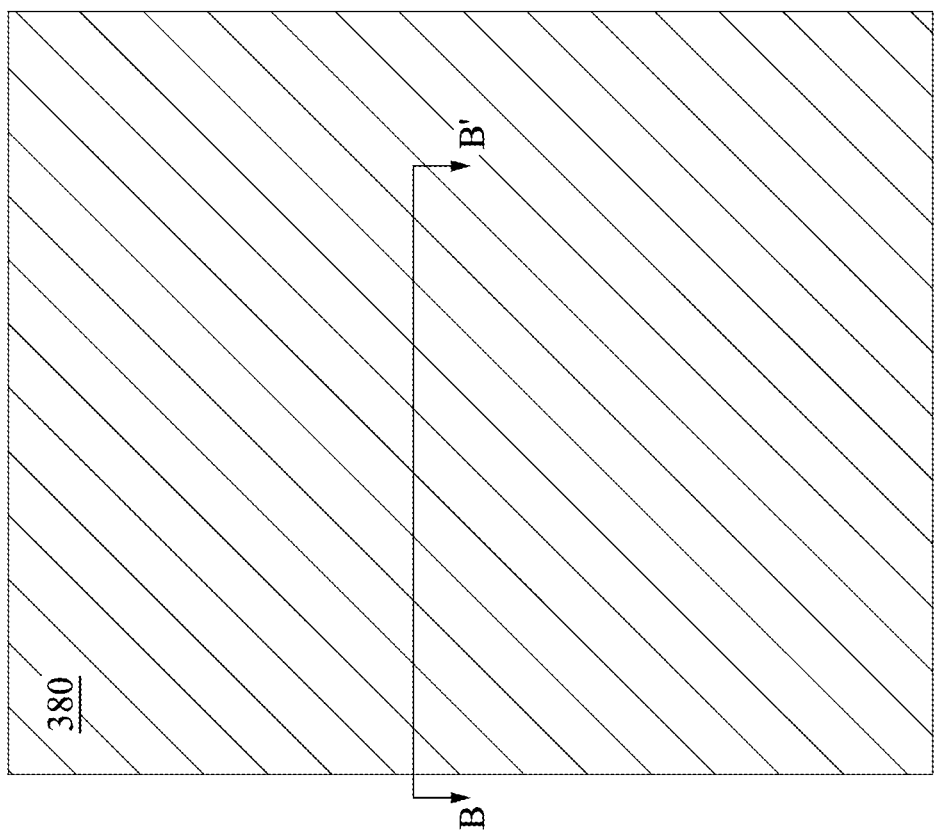
Figure 9B:
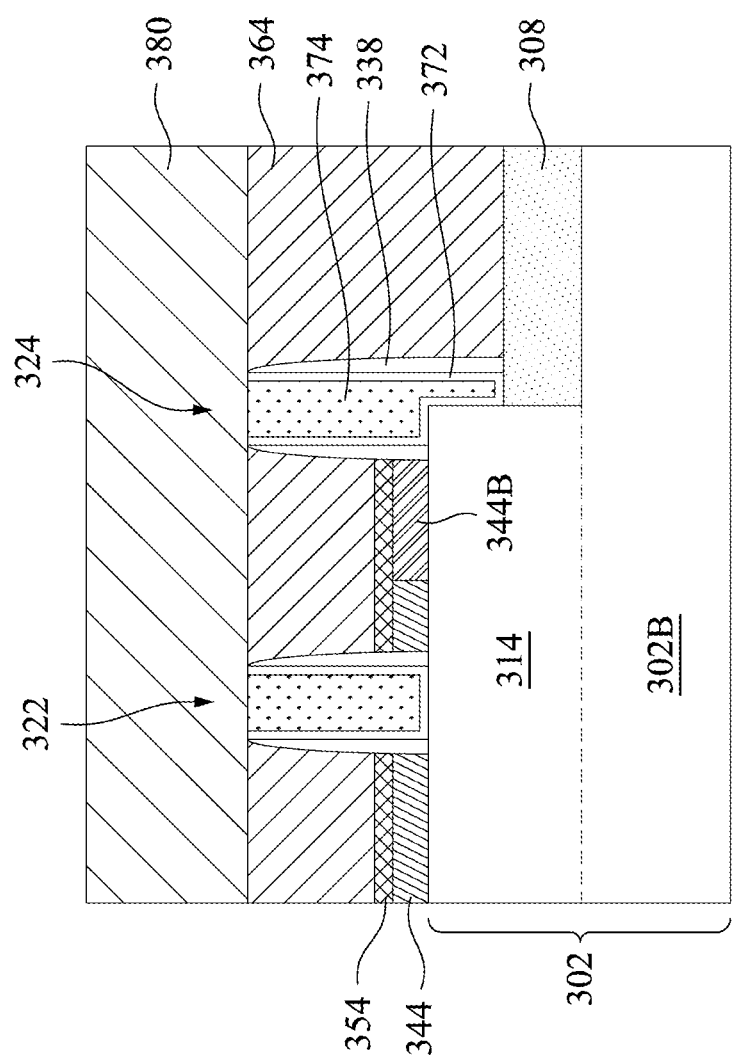

Referring to FIG. 2, the method 200 proceeds to operation 214, in which a contact level dielectric layer 380 is deposited on the ILD layer 364 and the gate structures 322, 324, 326 and 328, in accordance with some embodiments. FIG. 9A is a top view of the semiconductor structure of FIGS. 8A and 8B after forming the contact level dielectric layer 380 on the ILD layer 364 and the gate structures 322, 324, 326 and 328. FIG. 9B is a cross-sectional view of the semiconductor structure of FIG. 9A taken along line B-B'.

In some embodiments, the contact level dielectric layer 380 includes a dielectric material such as, for example, silicon dioxide, TEOS, undoped silicate glass, or doped silicate glass such as BPSG, FSG, PSG, or BSG. In some embodiments, the contact level dielectric layer 380 includes a dielectric material the same as the dielectric material of the ILD layer 364. In some embodiments, the contact level dielectric layer 380 includes a dielectric material different from the dielectric material of the ILD layer 364. In some embodiments, the contact level dielectric layer 380 is deposited, for example, using CVD, PECVD, PVD, or spin coating. In some embodiments, if the contact level dielectric layer 380 is not self-planarizing, a top surface of the contact level dielectric layer 380 is planarized, for example, by CMP. The planarized top surface of the contact level dielectric layer 380 is located above topmost surfaces of the gate structures 322, 324, 326 and 328.

Figure 10A:
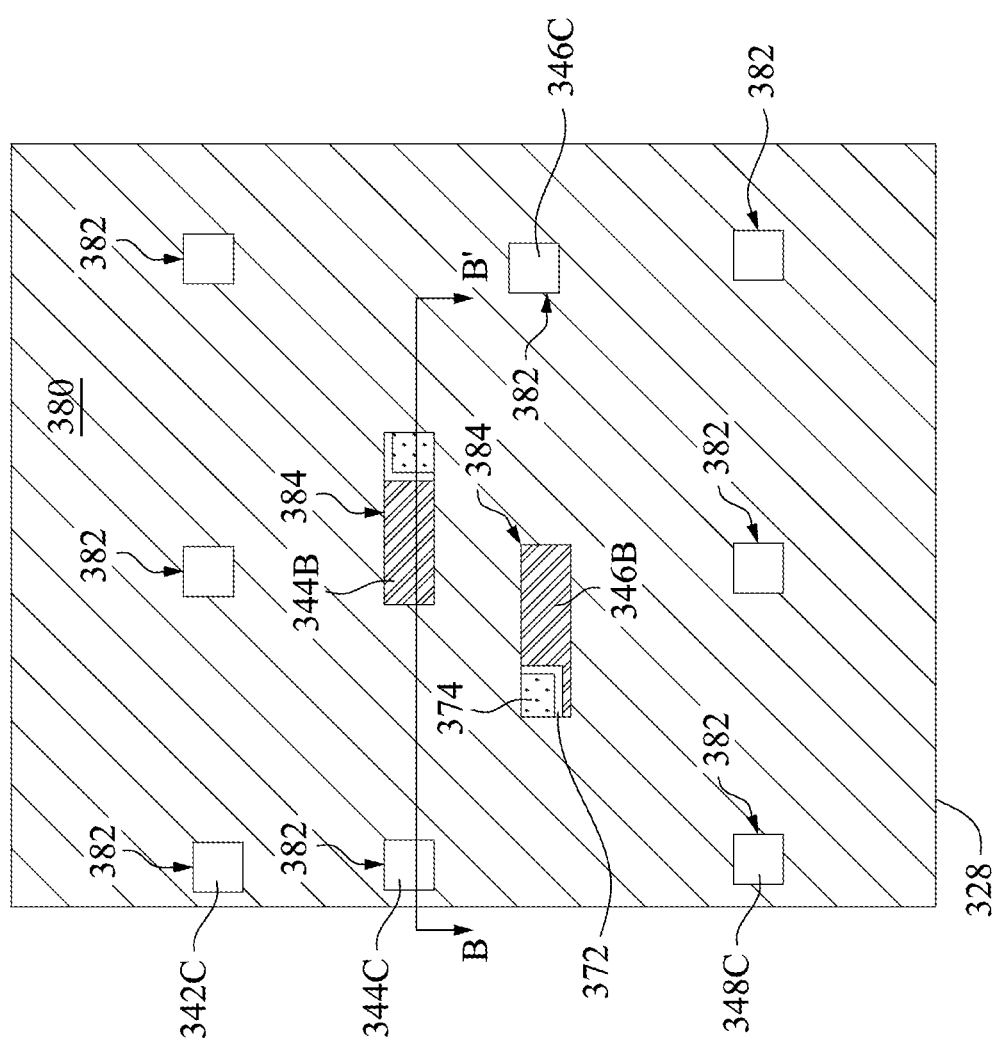
Figure 10B:
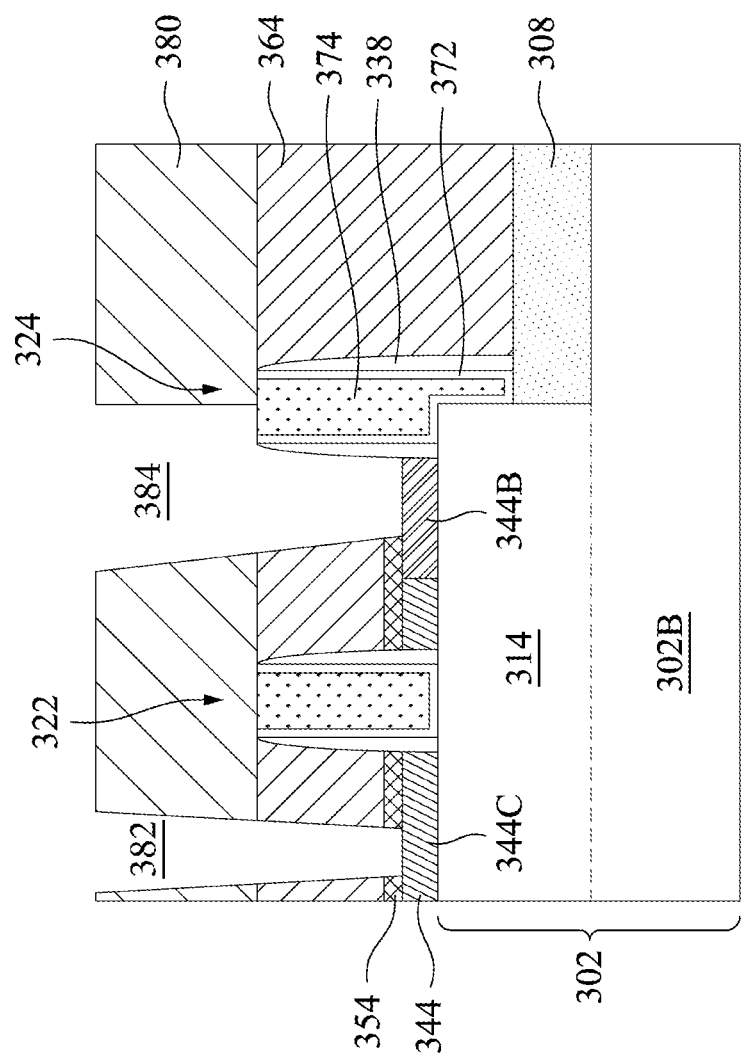

Referring to FIG. 2, the method 200 proceeds to operation 216, in which various contact openings 382, 384 are formed in the contact level dielectric layer 380 and the ILD layer 364, in accordance with some embodiments. FIG. 10A is a top view of the semiconductor structure of FIGS. 9A and 9B after forming various contact openings 382, 384 in the contact level dielectric layer 380 and the ILD layer 364. FIG. 10B is a cross-sectional view of the semiconductor structure of FIG. 10A taken along line B-B'.

Referring to FIGS. 10A and 10B, source/drain contact openings 382 are formed extending through the contact level dielectric layer 380, the ILD layer 364 and the oxide layers 352, 354, 356, 358, if present, each of which exposes a portion of a source/drain contact region 342C, 344C, 346C, 348C. Butted contact openings 384 are formed extending through the contact level dielectric layer 380, the ILD layer 364 and the oxide layers 356, 356, if present, each of which exposes a portion of a butted contact region 344B or 346B of one of pull-up transistors PU-1, PU-2 and a portion of the gate electrode 374 of a neighboring gate structure (e.g., gate structure 322 or 324).

In some embodiments, various contact openings 382, 384 are formed using lithographic etching processes. In some embodiments, forming contact openings 382, 384 includes using one or more etching processes such as a wet etch, a dry etch such as RIE or plasma etch, or a combination thereof. In some embodiments, forming contact openings 382, 384 includes using one or more etchant materials. In some embodiments, forming contact openings 382, 384 includes using one or more of $Cl_2$, $SF_6$, HBr, HCl, $CF_4$, $CHF_3$, $C_2F_6$, $C_4F_8$, or other similar etchant materials. In some embodiments, a mask layer (not shown) is first deposited over the contact level dielectric layer 380 and lithographically patterned to form openings therein. The openings expose portions of the contact level dielectric layer 380 wherein contact openings 382, 384 are to be formed. In some embodiments, the mask layer is a photoresist layer or a photoresist layer in conjunction with hardmask layer(s). The pattern in the mask layer is transferred through the contact level dielectric layer 380 and the ILD layer 364 to define contact openings 382, 384 therein. The patterned mask layer is subsequently removed, for example, using oxygen-based plasma etching.

Figure 11A:
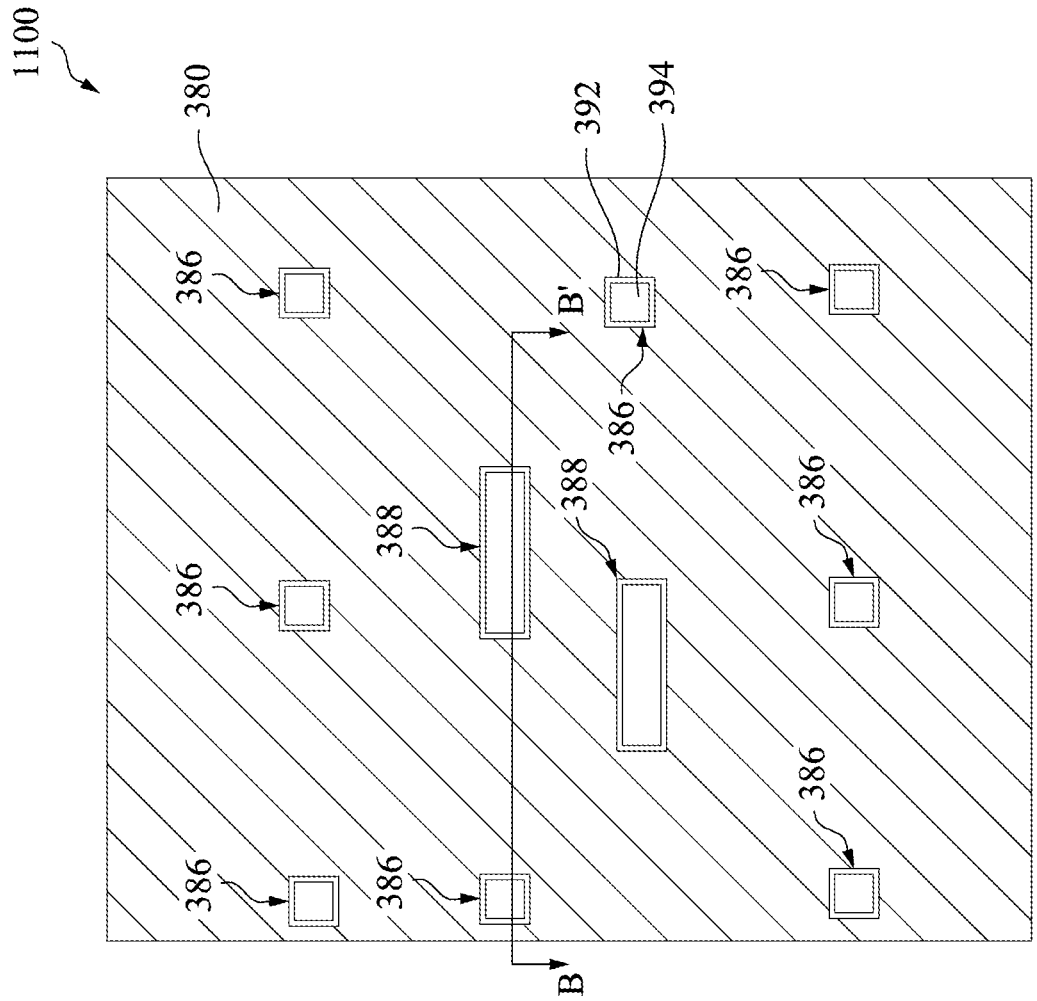
Figure 11B:
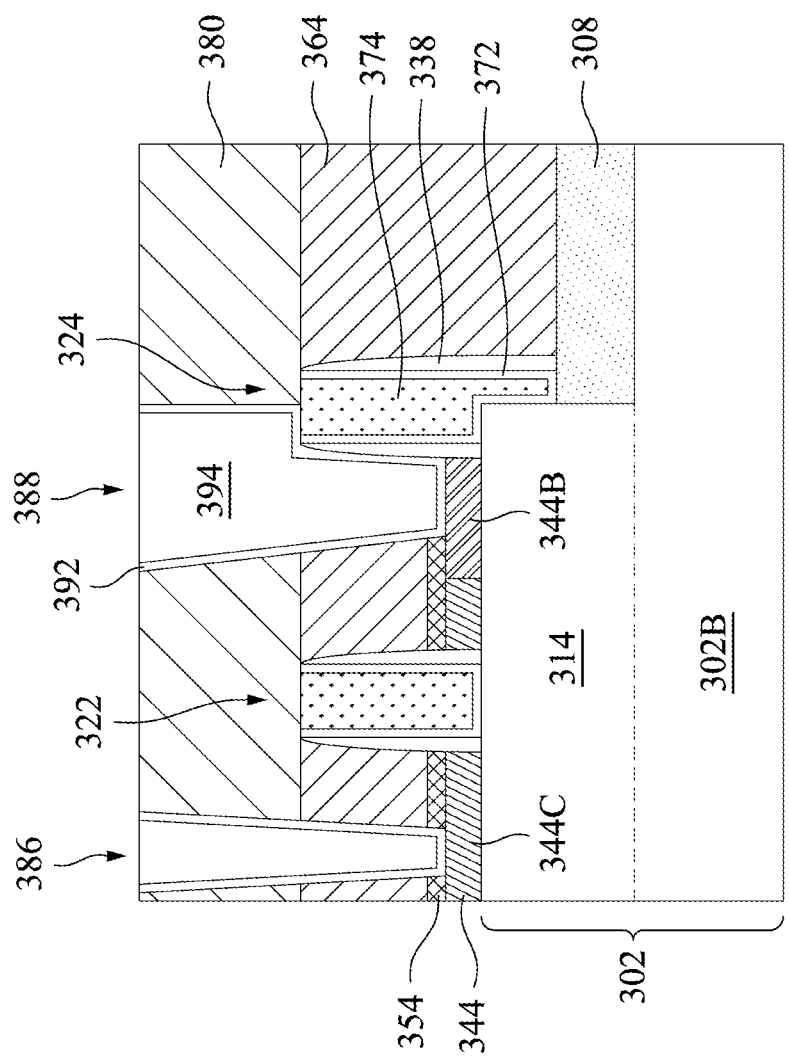

Referring to FIG. 2, the method 200 proceeds to operation 218, in which various contacts including source/drain contacts 386 and butted contacts 388 are formed, in accordance with some embodiments. FIG. 11A is a top view of the semiconductor structure of FIGS. 10A and 10B after forming the source/drain contacts 386 and the butted contacts 388. FIG. 11B is a cross-sectional view of the semiconductor structure of FIG. 11A taken along line B-B'.

Referring to FIGS. 11A and 11B, the source/drain contacts 386 are formed in the source/drain contact openings 382. The source/drain contacts 386 are in direct contact with respective source/drain contact regions 342C, 344C, 346C, 348C, thereby providing electrical connection to respective source/drain structures 342, 344, 346, 348 for transistors PU-1, PU-2, PD-1, PD-2, PG-1 and PG-2 in the SRAM cell. The butted contacts 388 are formed in the butted contact openings 384. The butted contacts 388 are in direct contact with respective butted contact regions 344B, 346B and the gate electrodes 374 of respective gate structures 322, 324. The butted contacts 388 form cross-coupling connections between respective butted contact regions 344B, 346B and gate structures 322, 324 of transistors PU-1, PD-1, PU-2 and PD-2 in the SRAM cell. One butted contact 388 couples the source/drain structure 344 of transistor PU-1 to the gate structure 324 of transistors PU-2 and PD2, while the other butted contact 388 couples the source/drain structure 346 of transistor PU-2 to the gate structure 322 of transistors PU-1 and PD-1.

Each of the source/drain contacts 386 and butted contacts 388 includes a contact liner 392 and a contact plug 394 surrounded by contact liner 392. In some embodiments, contact liner 392 includes Ti, Ta, TiN, TaN, or combinations thereof. In some embodiments, contact plug 394 includes a conductive material such as, for example, W, Al, Cu, or alloys thereof.

In some embodiments, various contacts 386, 388 are formed by first depositing a contact liner layer (not shown) along sidewall and bottom surfaces of contact openings 382, 384 and the top surface of the contact level dielectric layer 380. In some embodiments, the contact liner layer is deposited using a conformal deposition process such as CVD or ALD. A conductive contact material layer (not shown) is subsequently deposited on the contact liner layer to fill in contact openings 382, 384. In some embodiments, the conductive contact material layer is deposited using CVD, PVD, plating, or other suitable deposition processes. Portions of the conducive contact material layer and the contact liner layer that are located above the top surface of contact level dielectric layer 380 are removed using a planarization process such as, for example, CMP. A remaining portion of the contact liner layer within each of contact openings 382, 384 constitutes a contact liner 392, while a remaining portion of the conductive contact material layer within each of contact openings 382, 384 constitutes a contact plug 394.

Because the ozone wet cleaning method utilized in the present disclosure helps to form patterned photoresist with improved profile that is free of notches on sidewalls of the patterned photoresist layer 360, the risk of dopants being implanted into portions of the source/drain structures 344, 346 masked by the patterned photoresist layer 360 through the notches during the implantation process for formation of the butted contact regions 344C, 346C is eliminated. As a result, the leakage of the butted contacts 388 is avoided, which leads to improved device stability.

One aspect of this description relates to a method of forming a semiconductor structure. The method includes forming a gate structure over an active region of a substrate. The method further includes forming an epitaxial layer over portions of the active region on opposite sides of the gate structure, the epitaxial layer comprising first dopants of a first conductivity type. The method further includes applying a cleaning solution comprising ozone and deionized water to the epitaxial layer, thereby forming an oxide layer on the epitaxial layer. The method further includes forming a patterned photoresist layer over the oxide layer and the gate structure, the patterned photoresist layer exposing a portion of the oxide layer. The method further includes forming a contact region in the portion of the epitaxial layer not covered by the patterned photoresist layer, the contact region comprising second dopants of a second conductivity type opposite the first conductivity type. The method further includes forming a contact overlying the contact region.

Another aspect of this description relates to a method of forming a semiconductor structure. The method includes forming a first transistor comprising a first gate structure and first source/drain structures on opposite sides of the first gate structure. The method further includes forming a second transistor comprising a second gate structure and second source/drain structures on opposite sides of the second gate structure. The method further includes cleaning surfaces of the first source/drain structures and the second source/drain structures using a cleaning solution comprising ozone and deionized water, the cleaning forming a first oxide layer on the surfaces of the first source/drain structures and a second oxide layer on the surfaces of the second source/drain structures. The method further includes forming a patterned photoresist layer to expose a portion of the first source/drain structures adjacent to the second gate structure and a portion of the second source/drain structures adjacent to the first gate structure. The method further includes implanting dopants into the exposed portion of the first source/drain structures and the exposed portion of the second source/drain structures to form a first butted contact region in the first source/drain structures, and a second butted contact region in the second source/drain structures. The method further includes forming a first butted contact contacting the first butted contact region and the second gate structure, and a second butted contact contacting the second butted contact region and the first gate structure.

Still another aspect of this description relates to a method of forming a semiconductor structure. The method includes forming a first active region and a second active region on a substrate. The method further includes forming a first gate structure extending over the first active region and a second gate structure extending over the second active region. Each of the first and second gate stacks includes a sacrificial gate stack and gate spacers on sidewalls of the sacrificial gate stack. The method further includes forming first source/drain structures on portions of the first active region that are not covered by the first gate structure and second source/drain structures on portions of the second active region that are not covered by the second gate structure. The method further includes applying a cleaning solution comprising ozone and deionized water to surfaces of the first and second source/drain structures. The cleaning forms a first oxide layer on the surfaces of the first source/drain structures and a second oxide layer on the surfaces of the second source/drain structures. The method further includes forming a patterned photoresist layer to expose a portion of the first source/drain structures proximate to the second gate structure and a portion of the second source/drain structures proximate to the first gate structure. The method further includes forming a first butted contact region in the exposed portion of the first source/drain structures and a second butted contact region in the exposed portion of the second source/drain structures, the first and second butted contact regions comprising dopants having a conductivity type opposite to dopants in the first and second source/drain structures. The method further includes depositing a first dielectric layer over the substrate to surround the first and second gate structures. The method further includes forming a functional gate stack to replace the sacrificial gate stack in each of the first and second gate structure. The method further includes depositing a second dielectric layer over the first dielectric layer and the first and second gate structures. The method further includes forming a first butted contact and a second butted contact within the first dielectric layer and the second dielectric layer, the first butted contact connecting the first butted contact region to the second gate structure, and the second butted contact connecting the second butted contact region to the first gate structure.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method of forming a semiconductor structure, comprising:
    forming a gate structure over an active region of a substrate;
    forming an epitaxial layer over portions of the active region on opposite sides of the gate structure, the epitaxial layer comprising first dopants of a first conductivity type;
    applying a cleaning solution comprising ozone and deionized water to the epitaxial layer, thereby forming an oxide layer on the epitaxial layer;
    forming a patterned photoresist layer over the oxide layer and the gate structure, the patterned photoresist layer exposing a portion of the oxide layer;
    forming a contact region in the portion of the epitaxial layer not covered by the patterned photoresist layer, the contact region comprising second dopants of a second conductivity type opposite the first conductivity type; and
    forming a contact overlying the contact region.

2. The method of claim 1, wherein sidewalls of the patterned photoresist layer are free of notches at a bottom portion of the patterned photoresist layer.

3. The method of claim 1, wherein the first dopants are p-type dopants, and the second dopants are n-type dopants.

4. The method of claim 1, wherein the oxide layer has a thickness ranging from about 0.1 Å to about 0.4 Å.

5. The method of claim 1, wherein the cleaning solution has an ozone concentration ranging from about 20 ppm to about 70 ppm.

6. The method of claim 1, wherein the cleaning solution is applied at a temperature of from about 15° C. to about 40° C.

7. The method of claim 1, wherein the epitaxial layer comprises silicon germanium.

8. The method of claim 1, wherein forming the contact region comprises implanting the second dopants into the portion of the epitaxial layer not covered by the patterned photoresist layer using the patterned photoresist layer as an ion implantation mask.

9. The method of claim 1, wherein the cleaning solution consists essentially of ozone and deionized water.

10. The method of claim 1, wherein forming the contact comprises:
    depositing at least one dielectric layer over the oxide layer and the gate structure;
    etching the at least one dielectric layer and the oxide layer to form a contact opening, the contact opening exposing the contact region; and
    forming the contact in the contact opening.

11. A method of forming a semiconductor structure, comprising:
    forming a first transistor comprising a first gate structure and first source/drain structures on opposite sides of the first gate structure;
    forming a second transistor comprising a second gate structure and second source/drain structures on opposite sides of the second gate structure;
    cleaning surfaces of the first source/drain structures and the second source/drain structures using a cleaning solution comprising ozone and deionized water, the cleaning forming a first oxide layer on the surfaces of the first source/drain structures and a second oxide layer on the surfaces of the second source/drain structures;
    forming a patterned photoresist layer to expose a portion of the first source/drain structures adjacent to the second gate structure and a portion of the second source/drain structures adjacent to the first gate structure;
    implanting dopants into the exposed portion of the first source/drain structures and the exposed portion of the second source/drain structures to form a first butted contact region in the first source/drain structures, and a second butted contact region in the second source/drain structures; and
    forming a first butted contact contacting the first butted contact region and the second gate structure, and a second butted contact contacting the second butted contact region and the first gate structure.

12. The method of claim 11, wherein the first and second oxide layers independently have a thickness independently ranging from about 0.1 Å to about 0.4 Å.

13. The method of claim 11, wherein the cleaning solution has an ozone concentration ranging from about 20 ppm to about 70 ppm.

14. The method of claim 11, wherein cleaning solution is applied at a temperature from about 15° C. to 40° C.

15. The method of claim 11, wherein the first source/drain structures comprise a first semiconductor material, the first oxide layer comprising an oxide of the first semiconductor material.

16. The method of claim 11, wherein the second source/drain structures comprise a second semiconductor material, the second oxide layer comprising an oxide of the second semiconductor material.

17. The method of claim 11, wherein the first and second source/drain structures comprise dopants of a first conductivity type, and the first and second butted contact regions comprise the dopants of a second conductivity type opposite the first conductivity type.

18. The method of claim 11, wherein forming the patterned photoresist layer comprises:
    depositing a photoresist layer over the first and second source/drain structures and the first and second gate structures;
    exposing the photoresist layer to a predetermined pattern; and
    developing the photoresist layer to form the patterned photoresist layer, wherein sidewalls of the patterned photoresist layer adjacent to the first and second source/drain structures are free of notches.

19. A method of forming a semiconductor structure, comprising:
    forming a first active region and a second active region on a substrate;
    forming a first gate structure extending over the first active region and a second gate structure extending over the second active region, each of the first and second gate structures comprising a sacrificial gate stack and gate spacers on sidewalls of the sacrificial gate stack;
    forming first source/drain structures on portions of the first active region that are not covered by the first gate structure and second source/drain structures on portions of the second active region that are not covered by the second gate structure;
    applying a cleaning solution comprising ozone and deionized water to surfaces of the first and second source/drain structures, the cleaning forming a first oxide layer on the surfaces of the first source/drain structures and a second oxide layer on the surfaces of the second source/drain structures;

forming a patterned photoresist layer to expose a portion of the first source/drain structures proximate to the second gate structure and a portion of the second source/drain structures proximate to the first gate structure;

forming a first butted contact region in the exposed portion of the first source/drain structures and a second butted contact region in the exposed portion of the second source/drain structures, the first and second butted contact regions comprising dopants having a conductivity type opposite to dopants in the first and second source/drain structures;

depositing a first dielectric layer over the substrate to surround the first and second gate structures;

forming a functional gate stack to replace the sacrificial gate stack in each of the first and second gate structure;

depositing a second dielectric layer over the first dielectric layer and the first and second gate structures; and forming a first butted contact and a second butted contact within the first dielectric layer and the second dielectric layer, the first butted contact connecting the first butted contact region to the second gate structure, and the second butted contact connecting the second butted contact region to the first gate structure.

20. The method of claim 19, further comprising removing the patterned photoresist layer, wherein removing the patterned photoresist layer removes the first and the second oxide layers.

* * * * *